US008582307B2

(12) United States Patent
Yu et al.

(10) Patent No.: US 8,582,307 B2
(45) Date of Patent: Nov. 12, 2013

(54) WIRELESS COMMUNICATION APPARATUS

(75) Inventors: Jiun-Jang Yu, Tianjhong Township, Changhua County (TW); Hsin-Hsien Yeh, Taichung (TW); Hong-Ching Lin, Kaohsiung (TW)

(73) Assignee: Industrial Technology Research Institute, Hsinchu (TW)

( * ) Notice: Subject to any disclaimer, the term of this patent is extended or adjusted under 35 U.S.C. 154(b) by 395 days.

(21) Appl. No.: 12/948,280

(22) Filed: Nov. 17, 2010

(65) Prior Publication Data

US 2011/0134622 A1 Jun. 9, 2011

(30) Foreign Application Priority Data

Dec. 3, 2009 (TW) .............................. 98141374 A
Oct. 8, 2010 (TW) .............................. 99134496 A

(51) Int. Cl.
*H05K 1/14* (2006.01)

(52) U.S. Cl.
USPC ...... 361/737; 361/736; 340/572.7; 340/572.8

(58) Field of Classification Search
USPC ........................................................ 439/76.2
See application file for complete search history.

(56) References Cited

U.S. PATENT DOCUMENTS

| | | | | |
|---|---|---|---|---|
| 6,483,473 | B1 | 11/2002 | King et al. | |
| 6,501,435 | B1 | 12/2002 | King et al. | |
| 6,853,345 | B2 | 2/2005 | King et al. | |
| 7,397,438 | B2 | 7/2008 | King et al. | |
| 7,460,078 | B2 | 12/2008 | King et al. | |
| 2003/0052786 | A1 * | 3/2003 | Dickinson | 340/572.8 |
| 2007/0013521 | A1 * | 1/2007 | Lindsay et al. | 340/572.1 |
| 2007/0069037 | A1 * | 3/2007 | Kawai | 235/492 |
| 2007/0200708 | A1 * | 8/2007 | Hayama et al. | 340/572.7 |
| 2007/0200782 | A1 * | 8/2007 | Hayama et al. | 343/795 |
| 2009/0008460 | A1 | 1/2009 | Kato | |
| 2009/0121030 | A1 | 5/2009 | Kato et al. | |
| 2009/0146821 | A1 | 6/2009 | Kato et al. | |
| 2009/0303010 | A1 * | 12/2009 | Sakama | 340/10.1 |
| 2010/0308118 | A1 * | 12/2010 | Kataya et al. | 235/492 |

FOREIGN PATENT DOCUMENTS

EP 1 898 488 3/2008

* cited by examiner

*Primary Examiner* — Tuan T Dinh
*Assistant Examiner* — Steven Sawyer
(74) *Attorney, Agent, or Firm* — McClure, Qualey & Rodack, LLP

(57) ABSTRACT

A wireless communication apparatus in one embodiment includes a bag body and a radio frequency device. The bag body has at least a first slot, which extends to an edge of the bag body. The radio frequency device including a wireless integrated circuit chip is for radio-frequency signal transmission or receiving, and is disposed across a portion of the first slot and coupled to two connection ends of the bag body so that the bag body between the two connection ends serves as an inductance circuit. The inductance circuit of the two connection ends of the bag body is based on metallic material. An impedance of the inductance circuit is for conjugate matching with that of the radio frequency device and is determined according to a plurality of geometric parameters including: a distance from the edge to the wireless integrated circuit chip, and size of the first slot.

17 Claims, 19 Drawing Sheets

WIRELESS COMMUNICATION APPARATUS

This application claims the benefit of Taiwan application Serial No. 98141374, filed Dec. 3, 2009, and Taiwan application Serial No. 99134496, filed Oct. 8, 2010, the subject matters of which are incorporated herein by reference.

BACKGROUND

1. Technical Field

The disclosure relates in general to a wireless communication apparatus, and more particularly to a structure equipping an object with wireless communication function.

2. Description of the Related Art

To achieve excellent water-proof and air-proof, metallized bags are employed for packaging food or objects, and packing bags used in such purpose contribute to 70% of profit to packing bag manufacturers. If the metallized bags can further provide wireless communication function, the metallized bag products will become more valuable and the profit would be increased accordingly. Thus, the logistics industry seeks for a solution of metallized bags with wireless communication function.

A general wireless communication component disposed on a metallized bag cannot perform communication due to lower radiation efficiency or impedance mismatch. Conventionally, an on-metal tag applicable to metallic environment is used instead to reduce the influence of the metal on the tag. However, the manufacturing process is complicated and incurs expensive cost and thus cannot be widely used.

In addition, the wireless communication function can be implemented with an opening formed on the metallized bag. As the slot structure needs to have an opening formed on the metallized bag, the water-proof and air-proof function of the metallized bag will be affected. Besides, the things packed in the metallized bag will have an impact on the characteristics of the metallized bag with slot structure. According to the simulation result, if the permittivity of the contents is higher than 2, the reading performance will be low. Furthermore, when the packing bags are stacked, the slot antenna is shielded by metal and the signal from the bag cannot be read.

Thus, the conventional structure which implements wireless communication function on metallized bags still has to be improved in terms of communication effectiveness and cost.

SUMMARY

The disclosure is directed to a structure of a wireless communication apparatus. Packing bag products in general can be designed according to the structure to facilitate wireless communication function. In an embodiment, the radiating structure is embedded into the body of a metallized bag. For example, a slot located on the bag body extends outward and the portion of the bag body between two connection ends across the slot is utilized for conjugate matching a wireless communication component that is connected to the two connection ends. Thus, the impedance can be adjusted through the size, the shape of the radiating structure, and the position of the wireless communication component.

According to a first aspect of the disclosure, a wireless communication apparatus is provided. The wireless communication apparatus includes a bag body and a radio frequency device. The bag body has at least a first slot, which extends to an edge of the bag body. The radio frequency device, including a wireless integrated circuit chip, for radio-frequency signal transmitting or receiving, and the radio frequency device is disposed across a portion of the first slot and coupled to two connection ends of the bag body. A portion of the bag body between the two connection ends of the bag body serves as an inductance circuit and the inductance circuit is based on a metallic material. An impedance of the inductance circuit is for conjugate matching with a for conjugate matching with an impedance of the wireless integrated circuit chip and is determined according to at least a plurality of geometric parameters, including a distance from the edge to the wireless integrated circuit chip, and size of the first slot.

According to a second aspect of the disclosure, a wireless communication apparatus is provided. The wireless communication apparatus includes a bag body and a radio frequency device. Based on the wireless communication apparatus according to the above first aspect, the bag body according to the second aspect further has at least a second slot, which is located on the conductive portion and extends outward and is separated from the first slot. The geometric parameters further include the length of the second slot and a distance between the second slot and the first slot.

The above and other aspects of the disclosure will become apparent from the following detailed description of the preferred but non-limiting embodiments. The following description is made with reference to the accompanying drawings.

DETAILED DESCRIPTION

First Embodiment

Figure 1A:
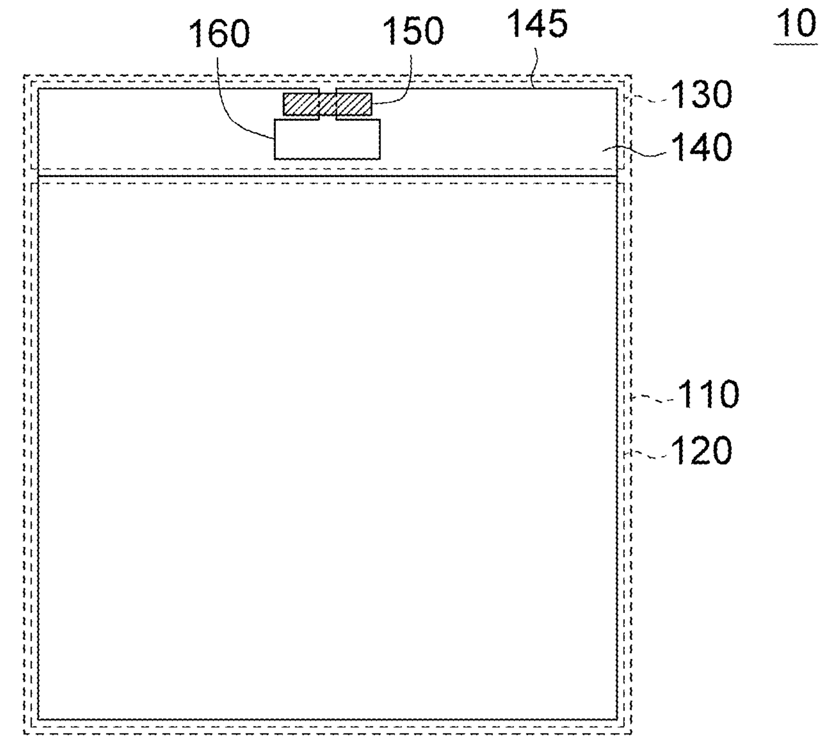
FIG. 1A shows a wireless communication apparatus according to a first embodiment.

Referring to FIG. 1A, a wireless communication apparatus according to a first embodiment is shown. The embodiment can be applied to a packing bag to facilitate wireless communication function. Examples of the packing bag include metallized bags, moisture barrier bags, and food or object packing bags composed of several films of aluminum or plastics. The wireless communication apparatus 10 includes a bag body 110 and a radio frequency device 150. The bag body 110 includes a packing member 120 and an impedance matching member 130. The impedance matching member 130 includes a conductive portion 140, e.g., having a metallic film. The conductive portion 140 has at least a first slot 160, which is located on the impedance matching member 130 and extends to an edge 145 of the conductive portion 140. The packing member 120 includes a conductive portion, substantially connected to the conductive portion 140 of the impedance matching member 130. The radio frequency device 150 is for radio-frequency signal transmitting or receiving. The radio frequency device 150 is disposed across a portion of the first slot 160 which extends to the edge 145 and is electrically connected to two connection ends (such as connection ends 141 and 142 of FIG. 1F) of the conductive portion 140, so that the part of the conductive portion 140 between the two connection ends serves as an inductance circuit or a loop electrode. An impedance between the two connection ends of the conductive portion 140 is conjugate matched to an impedance of the radio frequency device 150, wherein the impedance of the conductive portion 140 is determined according to at least a plurality of geometric parameters including: the distance from the edge 145 to the radio frequency device 150, and the size and shape of the first slot 160.

Figure 1B:
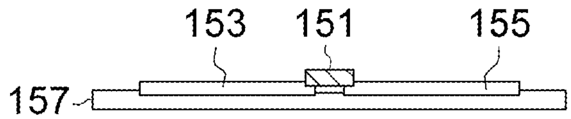
FIG. 1B illustrates a lateral view of an exemplary embodiment of the radio frequency device shown in the first embodiment of FIG. 1A.
Figure 1C:
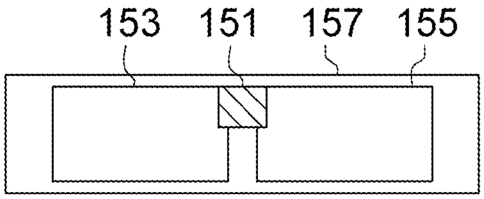
FIGS. 1C to 1E are vertical views illustrating three examples of the exemplary embodiment of the radio frequency device of FIG. 1B.
Figure 1D:
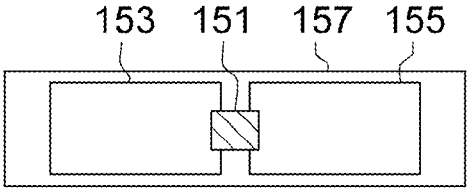
Figure 1E:
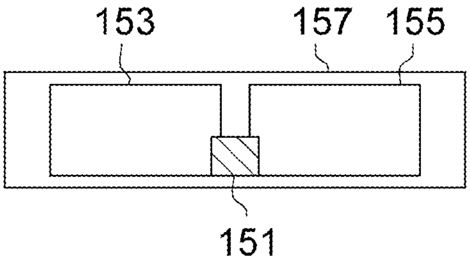

Referring to FIG. 1B, a lateral view illustrates an exemplary embodiment of the radio frequency device 150 shown in the first embodiment of FIG. 1A. As shown in FIG. 1B, the exemplary embodiment of the radio frequency device 150 includes a wireless integrated circuit chip, two pin extension strips 153, 155, and a dielectric layer 157. The wireless integrated circuit chip is an integrated circuit having wireless communication functionality, for example, radio frequency identification (RFID) chip or other appropriate wireless communication chip, available commercially, having an antenna, radio frequency interface, control circuit, and memory. The pin extension strips 153 and 155 are used for extension of the two connection pins of the wireless integrated circuit chip 151, such as a metallic layer formed on a dielectric layer, for example, the dielectric layer 157. FIGS. 1C to 1E are vertical views illustrating three examples of the exemplary embodiment of the radio frequency device 150 of FIG. 1B, wherein the wireless integrated circuit chip can be disposed on different locations of the pin extension strips, depending on the requirement for design. As shown in FIGS. 1C to 1E, the wireless integrated circuit chip 151 is disposed on the upper, middle, and lower positions of the pin extension strips 153 and 155, respectively. For showing the wide variety of embodiments, the wireless integrated circuit chip 151 may be illustrated in different locations inside the radio frequency device 150 in the following embodiments. Those embodiments are not limiting the implementation and one of ordinary skill in the art can make adjustment on them according to the requirement.

In addition, the portion of the bag body 110 that is connected to the radio frequency device 150 can be conjugate matched to the impedance of the wireless radio frequency device 150. Thus, it is unnecessary for the wireless communication apparatus 10 to equipped, either internally or externally, with a circuit for conjugate matching between the bag body 110 and the radio frequency device 150, such as a feeder circuit. In practical application, a loop structure such as the conductive portion 140 of FIG. 1A can be formed on the metallic film near the edge of a metallized bag, so that the characteristic impedance of the metallized bag is inductive. Thus, the magnitude of the characteristic impedance can be adjusted to match various RFID modules by adjusting the distance from the edge 145 to the radio frequency device 150, and the size of the loop structure.

Figure 1F:
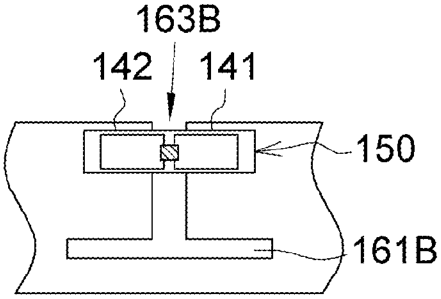
FIGS. 1F and 1G show two examples of the first slot of the impedance matching member of the wireless communication apparatus of FIG. 1A according to the first embodiment.
Figure 1G:
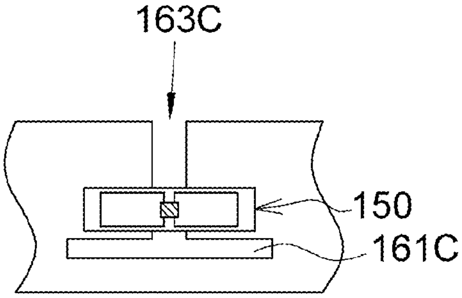
Figure 2:
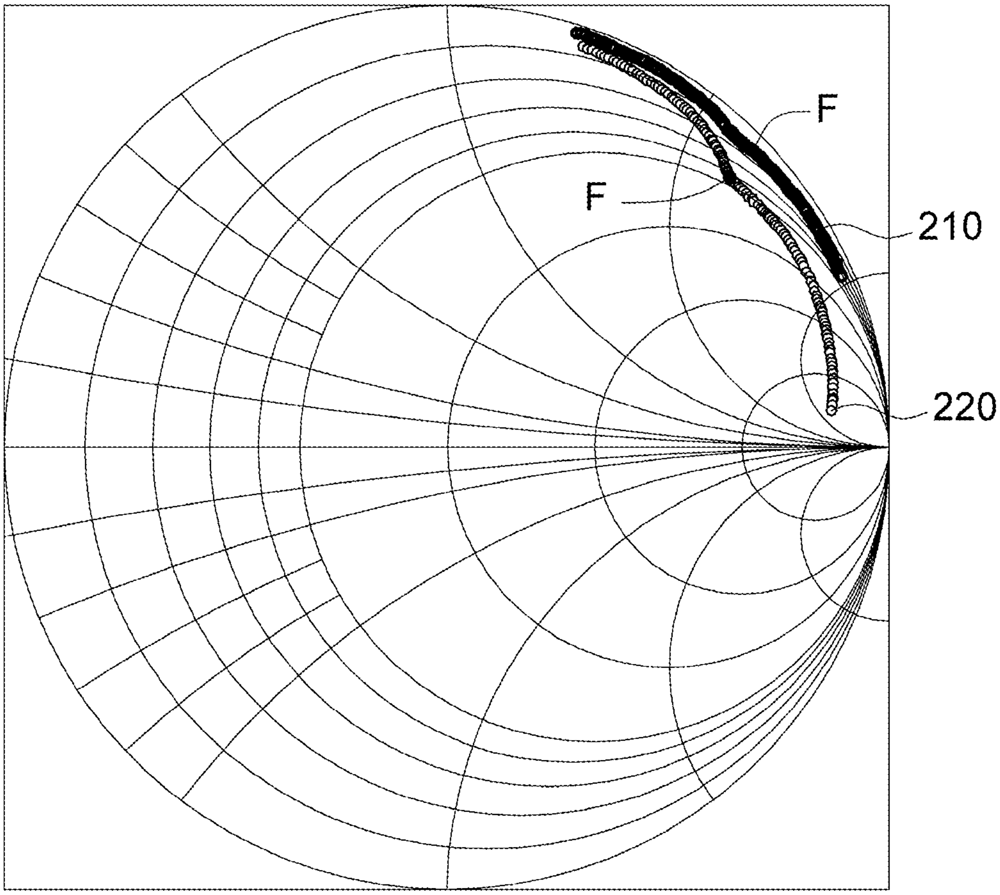
FIG. 2 shows a Smith chart corresponding to the two examples of FIGS. 1F and 1G.

Referring to FIGS. 1F and 1G, two examples of first slot of the impedance matching member of the wireless communication apparatus of FIG. 1A according to the first embodiment are shown. In FIG. 1F, the first slot has an opening 161B and a sub-slot 163B, wherein the sub-slot 163B is connected to the opening 161B (that is, another sub-slot) and extends to the edge 145 of the conductive portion 140, and the radio frequency device 150 is disposed across a portion of the sub-slot 163B. In FIG. 1F, the connection position of the radio frequency device 150 is near the edge 145. The opening 161C of FIG. 1G is smaller than the opening 161B of FIG. 1F, and the radio frequency device 150 is disposed across the part of sub-slot 163C farther away from the edge 145. As indicated in FIG. 2, the impedance loci 210 and 220 in the Smith chart are based on simulation for the loop structure of the two examples shown in FIGS. 1F and 1G, wherein the F points of the two impedance loci 210 and 220 indicate operating frequencies at about 915 MHz and correspond to the impedances of 9+j142 and 22+j139, respectively. Thus, the impedance of the real part can be adjusted by changing the size of the above geometric parameters, and a number of detailed examples are disclosed below.

Figure 3A:
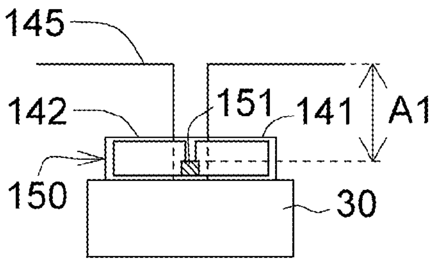
FIGS. 3A and 3B show two examples with different distances between a wireless integrated circuit chip 151 of the radio frequency device 150 and the edge when the shape of the opening of the impedance matching member of FIG. 1B remains unchanged.
Figure 3B:
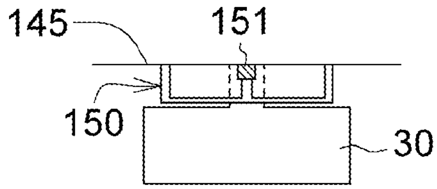
Figure 3C:
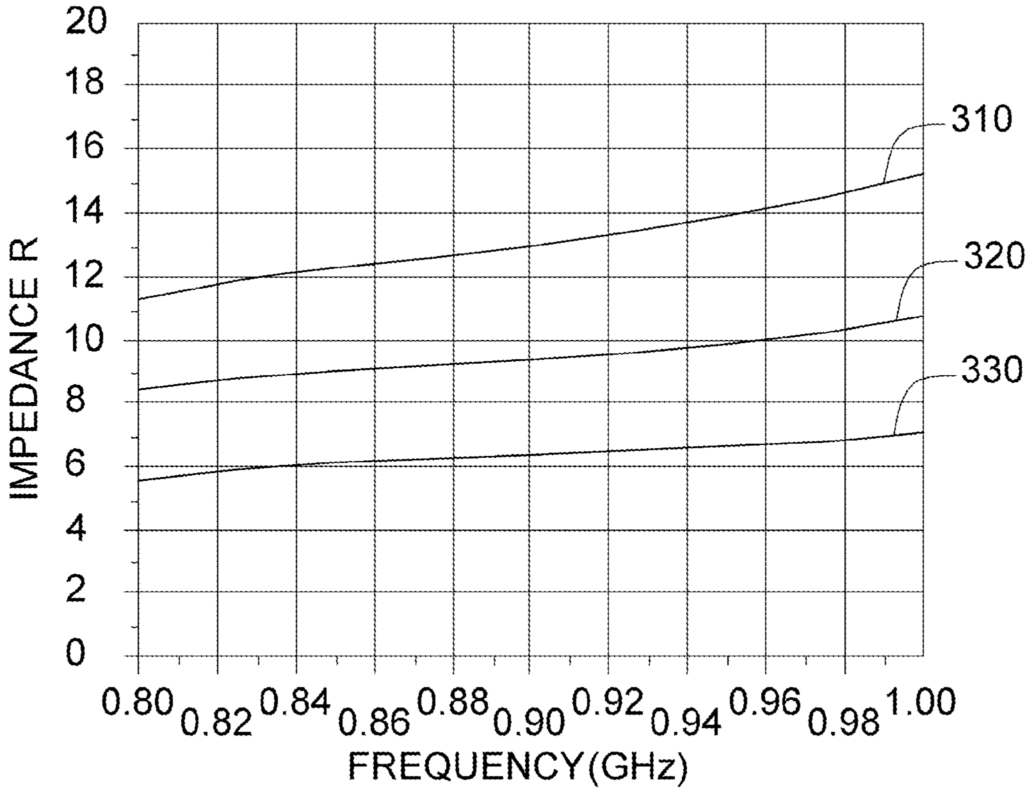
FIG. 3C shows the relationship between the real part of the impedance and frequency as the parameter A1 changes.
Figure 3D:
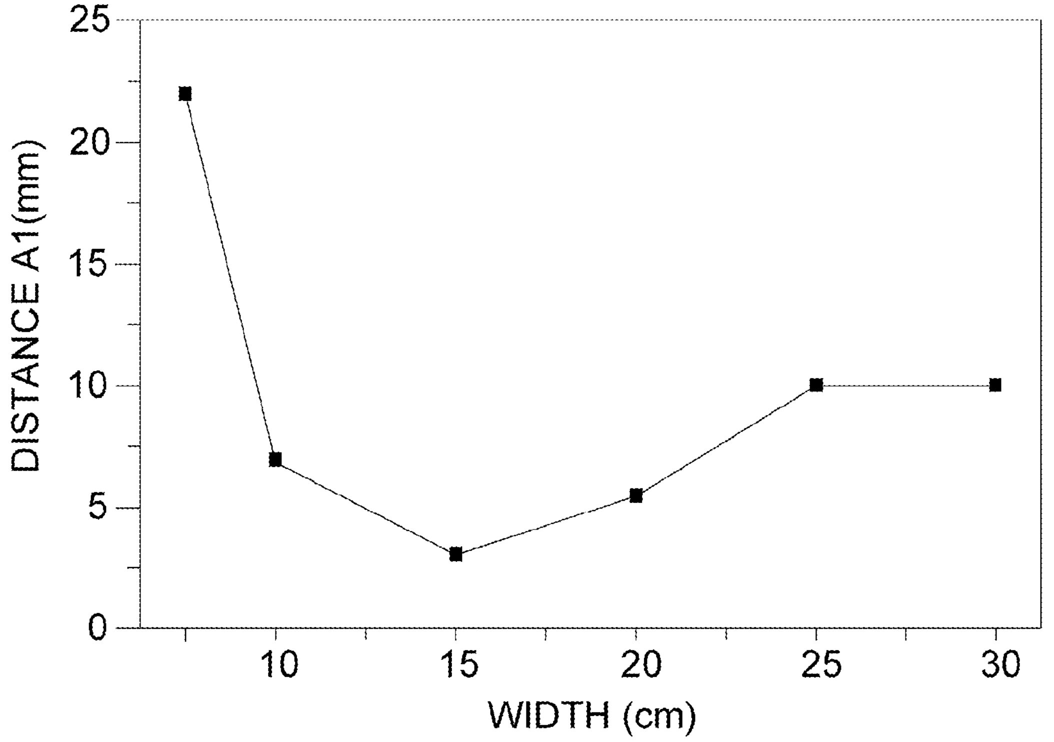
FIG. 3D illustrates the relationship between the distance A1 and width of the bag with respect to a target impedance.
Figure 4A:
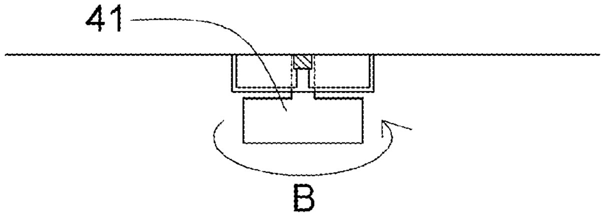
FIGS. 4A and 4B show two examples of the change in the shape of the opening when the sub-slot of the impedance matching member of FIG. 3B remains unchanged.
Figure 4B:
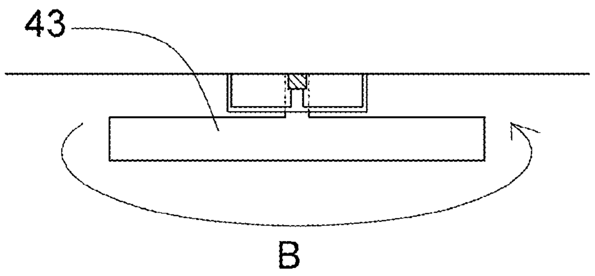
Figure 4C:
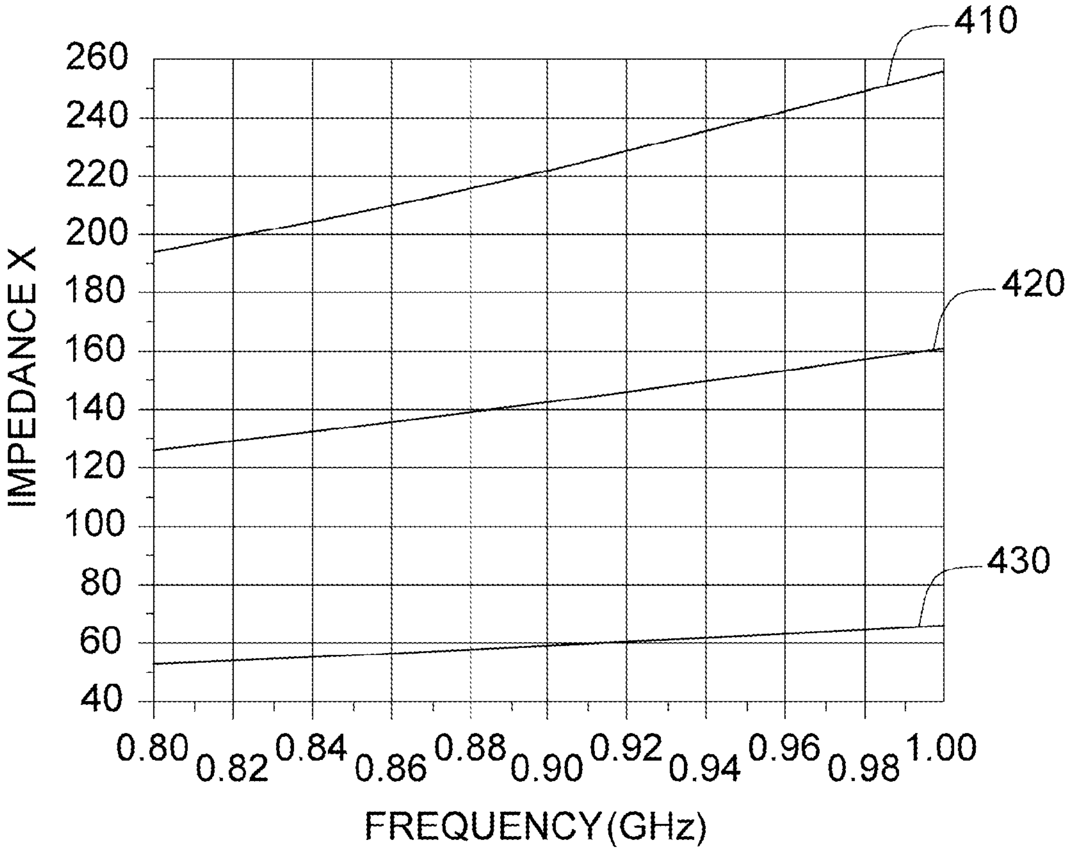
FIG. 4C shows the relationship between the imaginary part of the impedance and frequency as the parameter B changes.

According to an embodiment, the closer the radio frequency device 150 towards the conductive portion 140, the greater the real part R of the impedance (such as denoted by Z=R+jX) of the inductance circuit. In another aspect, the change in the shape of the opening as indicated by perimeter, for example, contribute to the imaginary part X of the impedance of the inductance circuit (that is, the reactance portion). FIGS. 3A and 3B show two examples of the distance between the wireless integrated circuit chip 151 of the radio frequency device 150 and the edge 145 when the shape of the opening of the impedance matching member remains unchanged. In FIG. 3A, the distance between the edge 145 and the wireless integrated circuit chip 151 is denoted by A1 and is about 8 mm. In FIG. 3B, the distance A1 is about 0 mm. Corresponding to the structures of FIGS. 3A and 3B, FIG. 3C shows the relationship between the real part R of the impedance Z and frequency as the parameter A1 changes. The curves 310, 320 and 330 respectively denote the relationships between the resistance R of the inductance circuit and frequency ranging from 800 MHz to 1 GHz when the distance A1 equals 8, 4, and 0 mm. In addition, FIGS. 4A and 4B show two examples of the opening with different shapes (41 or 43) when the sub-slot of the impedance matching member of FIG. 3B remains unchanged, wherein parameter B denotes the size of the first slot indicated by the perimeter of the opening. Corresponding to the structure of FIGS. 4A and 4B, the curves 410, 420, and 430 of FIG. 4C respectively indicate the relationship between the imaginary part of the impedance and frequency as the perimeter B decreases. As further shown by experiments, the real part of the impedance depends on the width of the edge 145 of the bag body and can be changed by adjusting the distance A1, thus resulting in no need of the additional impedance matching circuit. With respect to a target impedance of 5+j105, FIG. 3D illustrates the relationship between the distance A1 and width of the bag for the size of the bag changing from 7.5 cm*30 cm to 30 cm*30 cm. As indicated in the above examples, a suitable metallized bag having wireless communication function and matching a wireless communication chip can be designed by adjusting the geometric parameters according to the spirit of the above embodiment.

The impedance of the RFID chip currently available in the market is capacitive and can be expressed in the form of R−jX, wherein R ranges from about 5 to 50 Ohm and X ranges from about 60 to 200. The wireless radio frequency chip is operated at about 860 MHz to 960 MHz. Thus, the impedance matching member can be designed to be conjugate matched to the impedance of the wireless radio frequency chip by adjusting the opening 161B, a sub-slot 163B of the impedance matching member and the connection position of the radio frequency device 150.

Besides, the conductive portion of the packing member 120 can be manufactured or formed, according to actual requirements, to provide a space for packing things, for example, food such as tea or coffee beans, or electronic parts. The conductive portion of the packing member 120 and the conductive portion 140 of the impedance matching member 130 serve as a radiator, i.e., an antenna, for radio-frequency signal transmitting or receiving. For carrying objects or other purposes, the conductive portion of the packing member 120 may have an area larger than that of the impedance matching member 130 for meeting requirements. In a practical example, the packing member 120 can be formed by two layers of metallic films and be incorporated with the impedance matching member as an integral design.

Second Embodiment

Figure 5A:
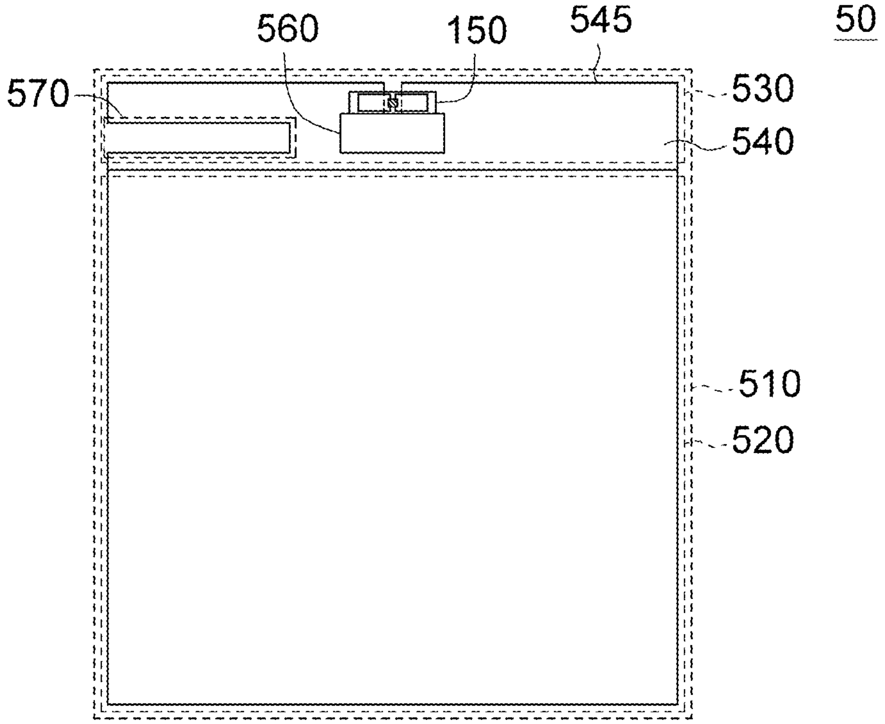
FIG. 5A shows a wireless communication apparatus according to a second embodiment.
Figure 5B:
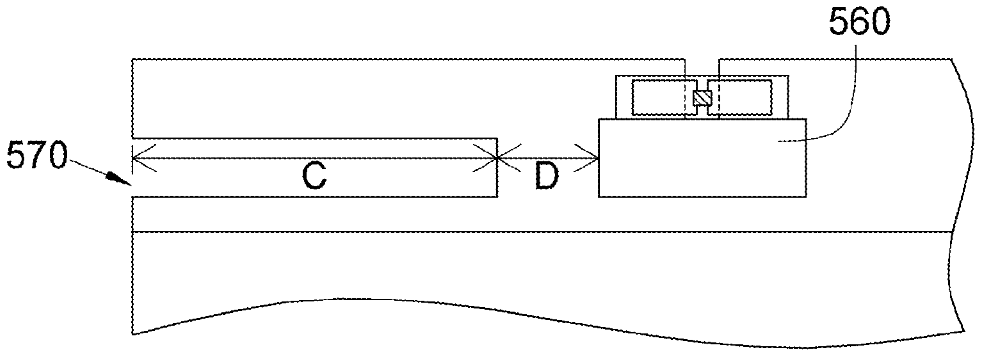
FIG. 5B shows the first slot and the second slot of FIG. 5A.

Referring to FIG. 5A, a wireless communication apparatus according to a second embodiment is shown. The wireless communication apparatus 50 includes a bag body 510 and a radio frequency device 150. The bag body 510 includes a packing member 520 and an impedance matching member 530. The impedance matching member 530 includes a conductive portion 540. The wireless communication apparatus 50 of FIG. 5A differs from the wireless communication apparatus 10 of FIG. 1A in that the conductive portion 540 of the present embodiment has at least two slots, namely, a first slot 560 and a second slot 570. The first slot 560 is located on the impedance matching member 530 and extends to an edge 545 of the conductive portion 540, and the second slot 570 is located on the conductive portion 540 and extends to another edge of the conductive portion 540. Besides, the portion of the conductive portion 540 between the two connection ends serves as an inductance circuit whose impedance is determined according to at least a plurality of geometric parameters. Examples of the geometric parameters include the distance from the edge 545 to the radio frequency device 150, the size and shape of the first slot 560, and further the parameters related to the size and shape of the second slot 570 and the distance between the second slot 570 and the first slot 560. Other elements of the present embodiment are similar to those of the first embodiment and are not repeated here for the sake of brevity.

Figure 6A:
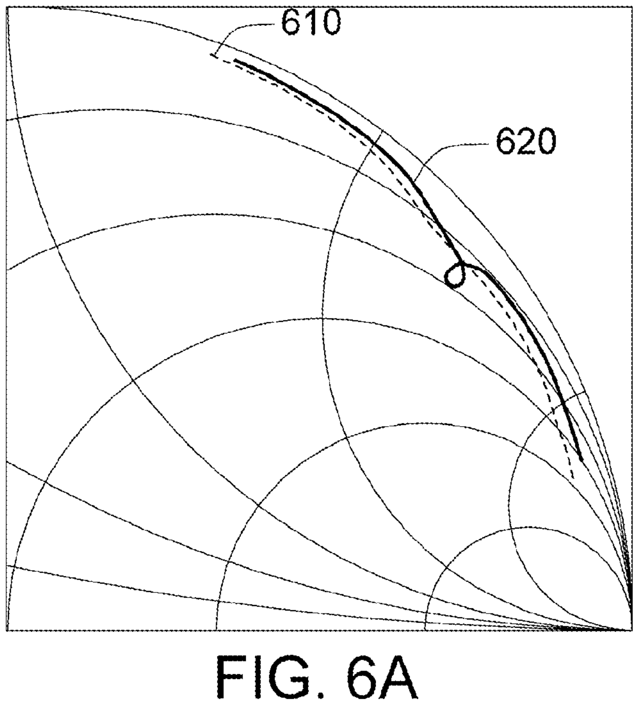
FIG. 6A is a portion of Smith chart showing the comparison of the characteristics of the impedance of the inductance circuit between the first and the second embodiment.
Figure 6B:
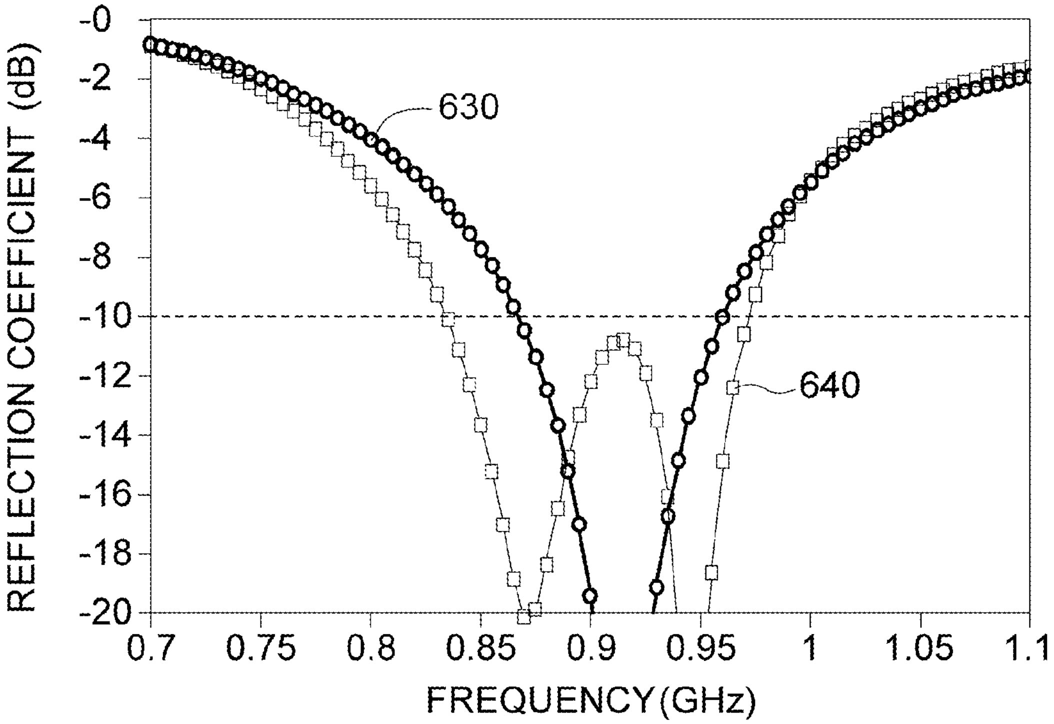
FIG. 6B shows the relationship between reflection coefficient and frequency of the first and the second embodiment.

The addition of the second slot 570 results in an impedance resonance, which can increase the matching bandwidth and the range for impedance adjustment. As indicated in FIG. 5A, the size and shape of the second slot 570, denoted by a parameter C, is indicated by the length of the second slot 570, for example, and a parameter D denotes the distance between the second slot 570 and the first slot 560. As indicated in FIG. 6A, the impedance loci 610 and 620 respectively denote the impedances of the first embodiment and the second embodiment, respectively, wherein the part of the impedance locus 620 indicated by an arrow has an additional resonance, as compare to the impedance locus 610. Further referring to FIG. 6B, the curves 630 and 640 respectively denote the relationship between the reflection coefficient of the inductance circuit and frequency for the first and the second embodiment. In FIG. 6B, the bandwidth of the first embodiment is 95 MHz and the bandwidth of the second embodiment is 140 MHz if the reflection coefficient of −10 dB is taken as a boundary.

Figure 7A:
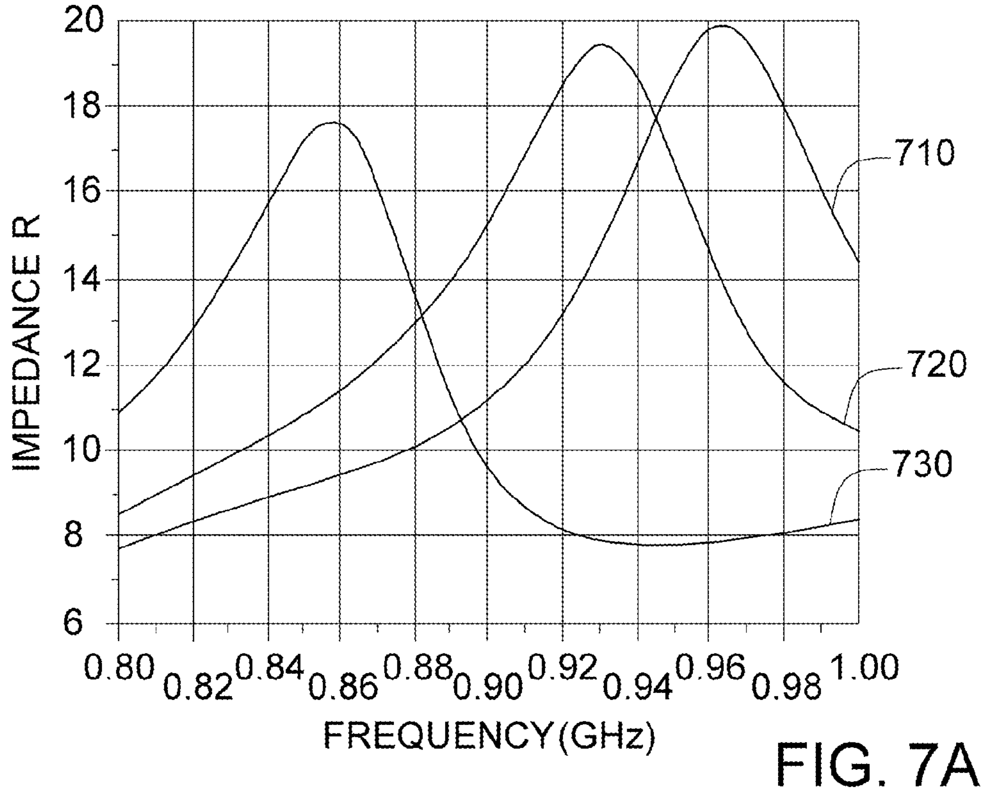
FIGS. 7A and 7B show the relationship between the impedance and frequency as the parameter C of the second slot changes.
Figure 7B:
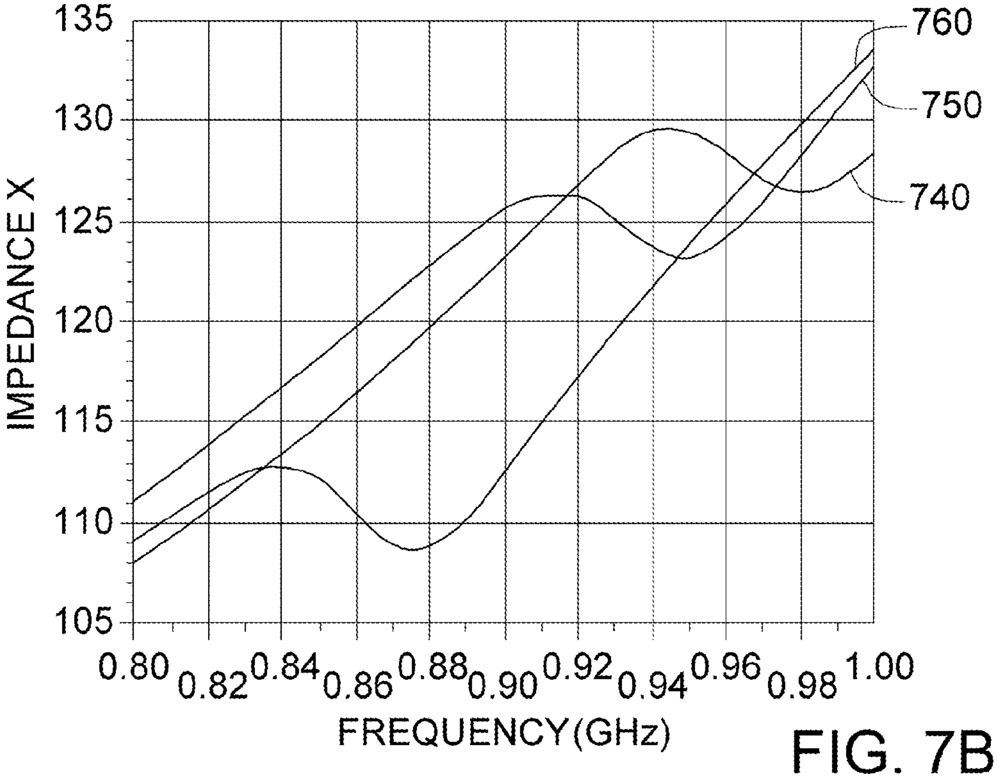
Figure 8A:
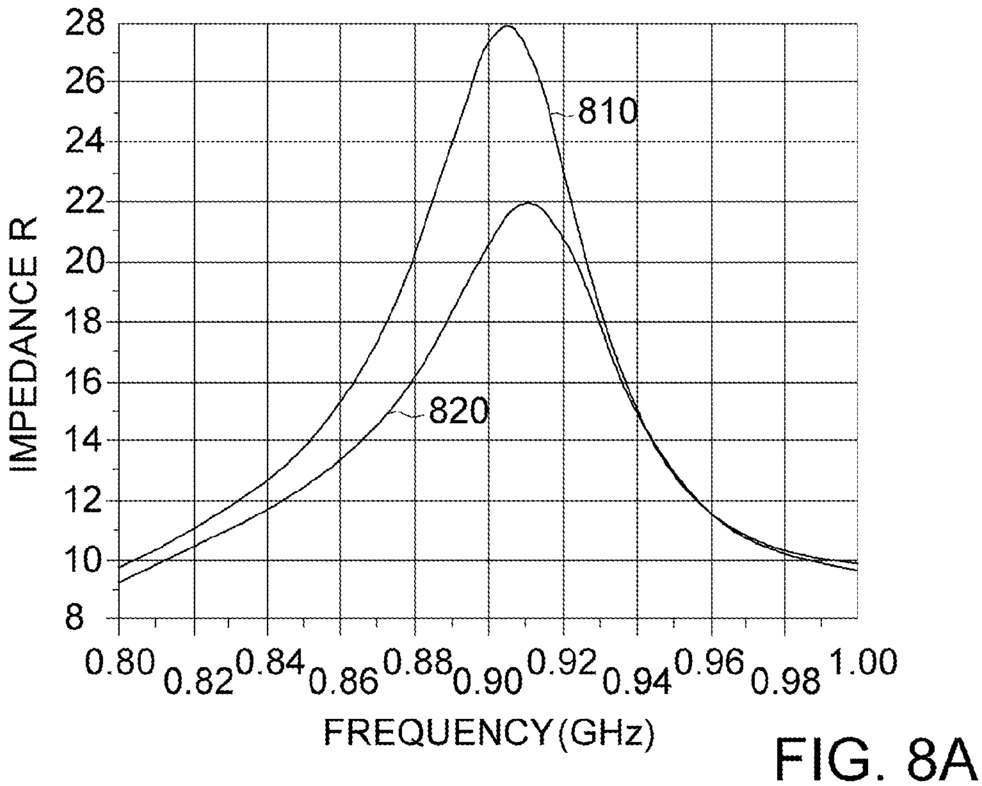
FIGS. 8A and 8B show the relationship between the impedance and frequency as the parameter D of the second slot changes.
Figure 8B:
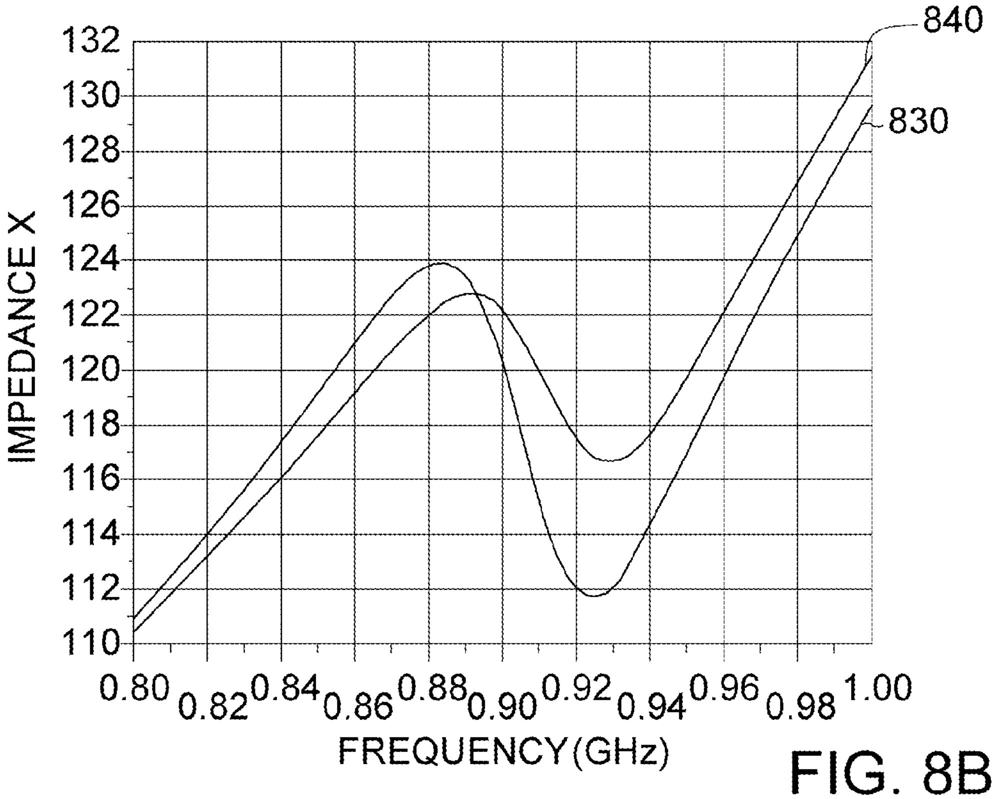

According to the above disclosure, the second embodiment has at least two slots so as to increase the resonance, the matching bandwidth, and the range for impedance adjustment. For example, the slot length of the second slot 570, i.e., the parameter C, can be used to adjust the resonance frequency, wherein the parameter C is about a corresponding ¼ wavelength of the operating frequency. Referring to FIG. 7A, when the parameter C equals 65 mm, 68 mm, 71 mm, the relationships between the real part R of the impedance Z and frequency are respectively illustrated by the curves 710, 720, and 730. Referring to FIG. 7B, when the parameter C equals 65 mm, 68 mm, and 71 mm, the relationships between the imaginary part X of the impedance Z and frequency are respectively illustrated by the curves 740, 750, and 760, wherein the frequency ranges between 800 MHz to 1 GHz. On the other hand, the parameter D can be used to adjust the impedance during resonance. For example, when the parameter D equals 9 mm and 11 mm, the relationships between the real part R of the impedance Z and frequency are respectively illustrated by the curves 810 and 820 of FIG. 8A. When the parameter D equals 9 mm and 11 mm, the relationships between the imaginary part X of the impedance Z and frequency are illustrated by the curves 830 and 840 of FIG. 8B. As indicated in FIG. 8A and FIG. 8B, around the resonance frequency 915 MHz, the ranges of change in the real part R and the imaginary part X of the impedance Z vary with the change of the parameter D.

In other embodiments, the second slot of FIG. 5A can be located at other positions of the conductive portion 540 (such as on the right or other positions) or one or more slots are further included on different location(s) thereof. With more slots being added, the matching bandwidth can be increased. Besides, the second slot can be of different shapes. For example, the opening can extend upward, or the second slot can be formed as an L-shaped slot with an opening extending upward.

Figure 9A:
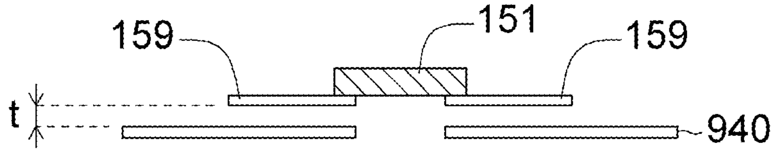
FIG. 9A shows a cross-sectional view of the connection portion between the impedance matching member and the radio frequency device 150.
Figure 9B:
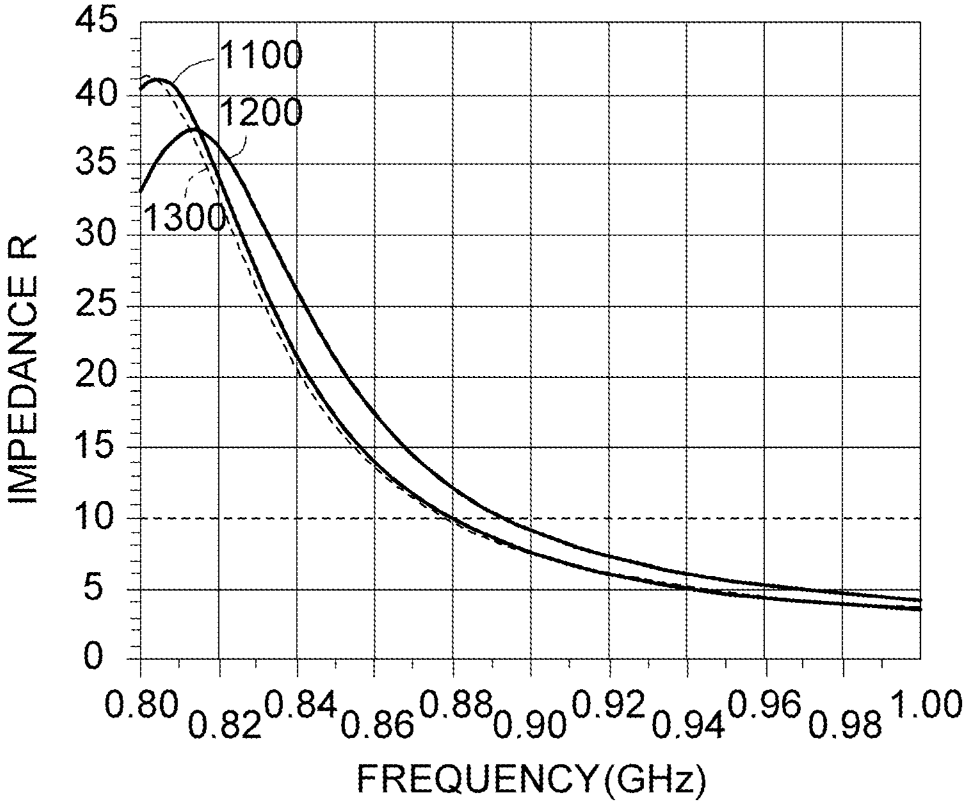
FIGS. 9B and 9C show the relationship between the impedance and frequency as coupling thickness t changes.
Figure 9C:
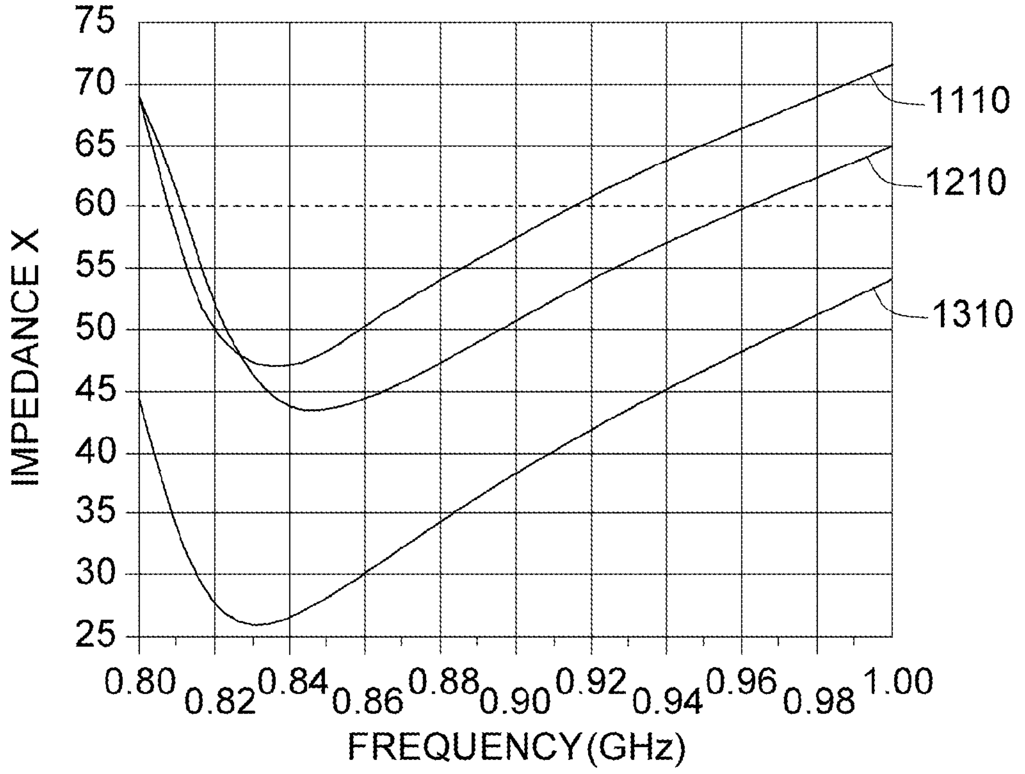
Figure 9D:
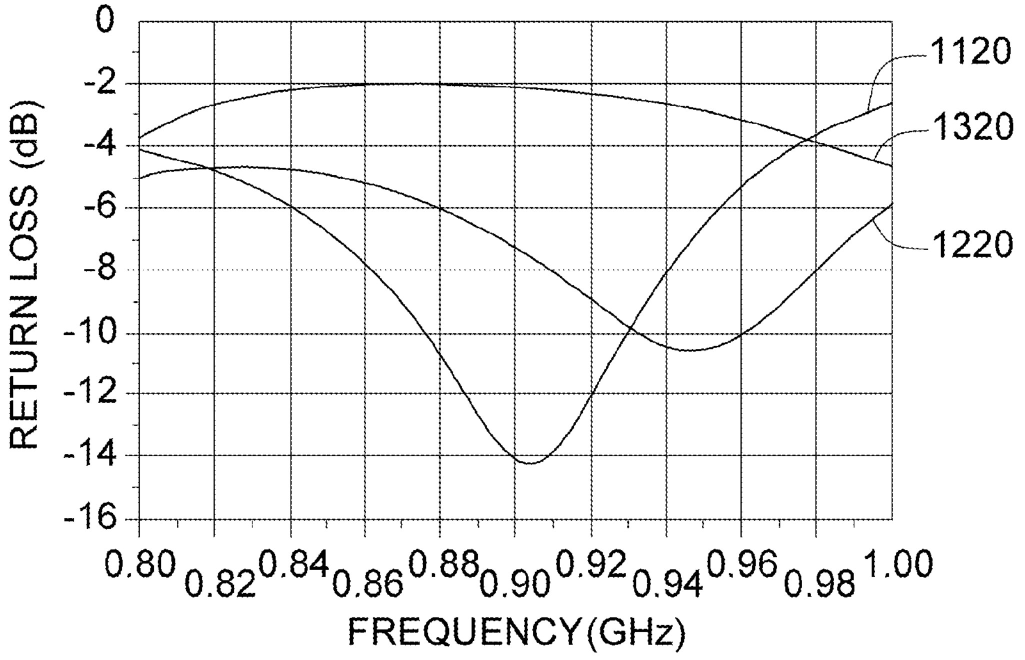
FIG. 9D shows the relationship between return loss and frequency as coupling thickness t changes.

In the above the first or the second embodiment, the radio frequency device 150, and the inductance circuit of the impedance matching member are, for example, electrically connected so as to avoid the influence of coupling effect on the impedance. Referring to FIG. 9A, a partial cross-sectional structure of the electrical connection portion between the impedance matching member and the radio frequency device 150 is illustrated and employed for comparison between electrical connection and electromagnetic coupling, and it is supposed that the impedance matching member and the radio frequency device 150 are joined by electromagnetic coupling, instead of electrical connection. The distance between the contacts (i.e., the contacts 159 of extension strip) and the conductive portion 940 is defined as t, wherein the distance t can be changed to elaborate the relationship between the coupling thickness (i.e., t) and impedance. It is supposed that the impedance of the radio frequency device is expressed as 10−60 j. Referring to FIGS. 9B and 9C, when the coupling thickness t equals 1 um, 3 um, 10 um, the relationships between the real part R of the impedance Z and frequency are illustrated by the curves 1100, 1200, and 1300, respectively, and the relationships between the imaginary part X of the impedance Z and frequency are respectively illustrated by the curves 1110, 1210, and 1310, respectively. The curves 1120, 1220, and 1320 of FIG. 9D denote the relationships between the corresponding return loss and frequency when the coupling thickness t equals 1 um, 3 um, and 10 um respectively. In the above examples, the impedance of the radio frequency device 150 equals 10−60 j, which indicates that the variance in the coupling thickness must be smaller than 10 um. If the impedance matching member and the radio frequency device 150 are connected by electromagnetic coupling instead of electrical connection, this imposes a severe restriction on the distance between the impedance matching member and the radio frequency device 150. For example, the coupling thickness must be less than 10 um, as exemplified above, so as to make the antenna be conformed to the requirements of impedance matching and efficiency. If the distance has small variance, the impedance of the bag body changes immediately. In this way, such change will have a significant impact on the impedance matching between the bag body and the radio frequency device as well as the communication performance of the device, as can be observed from the change in the return loss indicated in FIG. 9D.

Thus, in the above embodiment, the signal transfer between the radio frequency device 150 and the radiator are by way of electrical connection and not only electromagnetic coupling. In order to achieve contact of conductors, the electrical connection can be done via direct contact, or puncturing or hot pressing or ultrasonic welding, or via indirect contact through the use of conductive material such as a conductive adhesive. In general terms, electrical connection means contact of conductors or signal transfer between conductors via conductive particles; electromagnetic coupling refers to signal transfer between the conductors via an electrical field, magnetic field, or electromagnetic field, wherein the conductors may be separated by a nonconductive material. In short, any implementation capable of enabling the chip 151 and the impedance matching member to be electrically connected and conjugate matched can be employed and regarded as embodiments according to the disclosure.

Third Embodiment

Figure 10A:
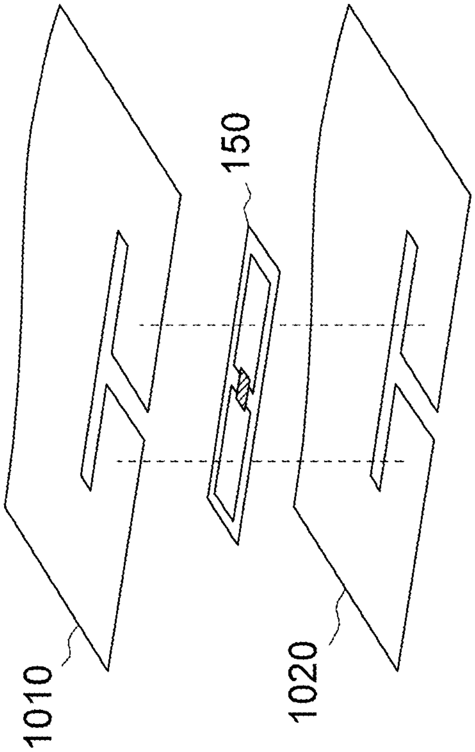
FIG. 10A illustrates a lateral view of a third embodiment of a wireless communication apparatus in which the radio frequency device 150 is embedded by the bag body.
Figure 10B:
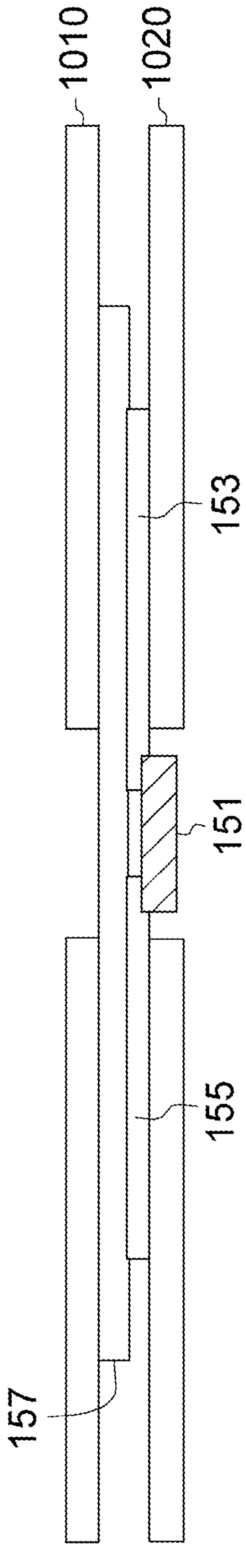
FIG. 10B illustrates a cross-sectional view of the connection portion between impedance matching member and the radio frequency device, as shown in FIG. 10A.

In the following, embodiments in which the radio frequency device 150 is embedded in the bag body are provided, so as to illustrate the other manners of implementation. FIG. 10A illustrates a third embodiment of a wireless communication apparatus, wherein a lateral view of the embodiment in which the radio frequency device 150 is embedded by the bag body. In FIG. 10A, the bag body includes a first packing material 1010 and a second packing material 1020. A radio frequency device 150 is disposed between the two packing materials 1010 and 1020 so as to form a sandwich structure. Each of the first and the second packing materials 1010 and 1020, for example, is a combination of a metallized layer and a dielectric layer (not shown). FIG. 10B illustrates a cross-sectional view of the portion with the radio frequency device 150 as shown in FIG. 10A, wherein the structure, in which both sides of the radio frequency device 150 are covered by the packing materials, is thus referred to as a double-side structure. In FIG. 10B, the pin extension strips 153 and 155 of the wireless integrated circuit chip 151 are electrical connected to the metallized layer of the second packing material 1020 (i.e., the metallized layer is faced upward) on one side, and are electromagnetically coupled to the metallized layer of the first packing material 1010 on another side since the dielectric layer 157 is disposed between the pin extension strips 153, 155 and the first packing material 1010. This double-side structure utilizes the two kinds of signal transfer approaches: electromagnetic coupling and electrical connection, thus enhancing the quality of signal transfer.

Fourth Embodiment

Figure 10C:
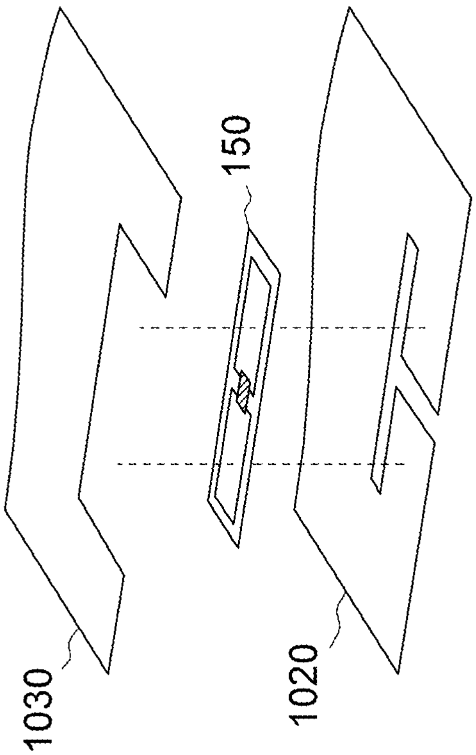
FIG. 10C illustrates a lateral view of a fourth embodiment of a wireless communication apparatus in which the radio frequency device 150 is covered by the bag body.
Figure 10D:
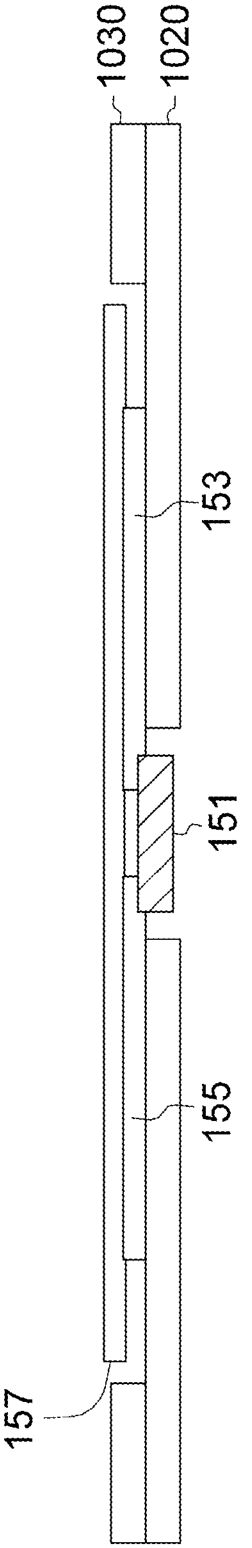
FIG. 10D illustrates a cross-sectional view of the connection portion between impedance matching member and the radio frequency device, as shown in FIG. 10C.

FIG. 10C illustrates a fourth embodiment of a wireless communication apparatus, wherein a lateral view of another embodiment in which the radio frequency device 150 is covered by the bag body. In FIG. 10C, the bag body includes a third packing material 1030 and a second packing material 1020. A radio frequency device 150 is disposed between the third packing materials 1030 and the second packing materials 1020. The third packing material 1030, for example, is a combination of a metallized layer and a dielectric layer. The embodiment of FIG. 10C differs from that of FIG. 10A in that the former, on one side, for example, the third packing material 1030 has a wider hollowed region for disposition of the radio frequency device 150 and on another side, the packing material, for example, the second packing material 1020 has a narrower hollowed region. FIG. 10D illustrates a cross-sectional view of the portion with the radio frequency device 150, wherein the structure, in which only one side of the radio frequency device 150 is covered by the packing material, is thus referred to as a single-side structure. In FIG. 10D, the pin extension strips 153 and 155 of the wireless integrated circuit chip 151 are electrical connected to the metallized layer of the second packing material 1020 (i.e., the metallized layer is faced upward) on one side. This structure can be employed to make the thickness of the whole apparatus to be reduced.

In the above third and fourth embodiments with the chip being covered, at least one side of the packing material and the radio frequency device employs electrical connection for signal transfer. However, the implementation of this application is not limited thereto. As shown below, the inventors, by experiment, have found that if the area of pin extension strips and the thickness between the pin extension strips and the metallized layer of the packing material (i.e., the coupling thickness t defined by FIG. 9A) satisfy some criteria, electromagnetic coupling can be adopted to enable signal transfer between the radio frequency device and the metallized layer of the packing material (or conductive layer). In this way, the problem that the communication performance of the device would be affected due to a small variance of the coupling thickness t as illustrated in FIGS. 9A to 9D will become insignificant or substantially would not occur.

Figure 10E:
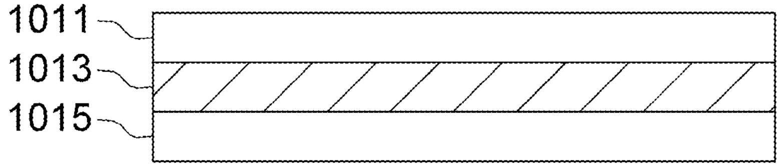
FIG. 10E illustrates the structure of a packing material of three layers.
Figure 10F:
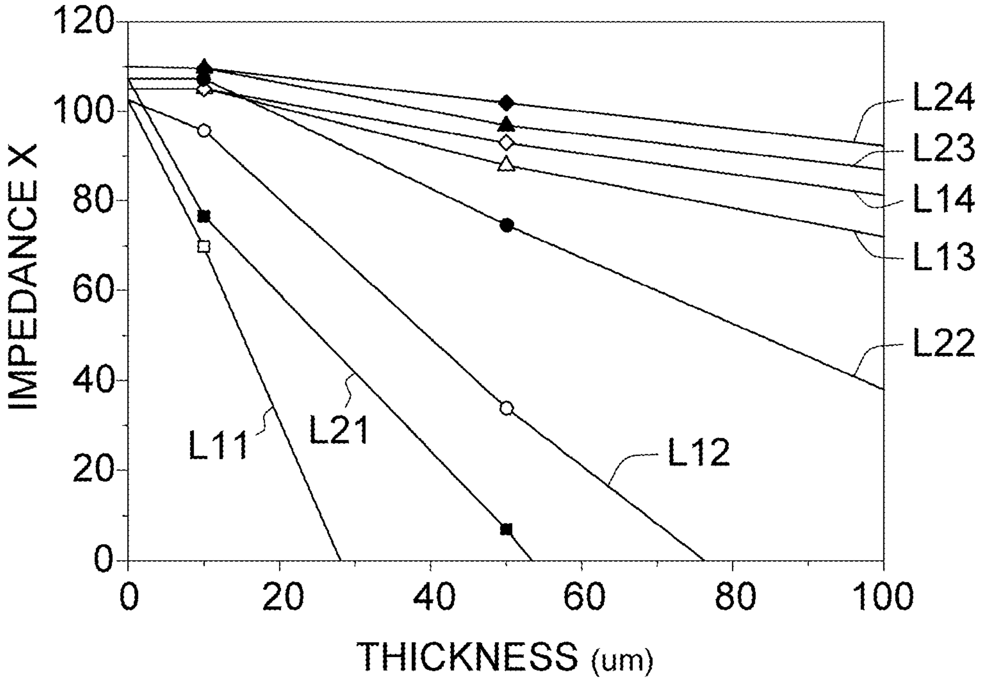
FIG. 10F is a diagram illustrating the relationship among areas of the pin extension strip, the thickness t between the pin extension strip and the metalized layer of the packing material, the imaginary part of the impedance X, with respect to the double-side structure of the third embodiment and the single-side structure of the fourth embodiment.

As an example, FIG. 10E illustrates the structure of a packing material of three layers, for example, including dielectric layer 1011 such as polyester, metalized layer 1013 such as aluminum, and dielectric layer 1015 such as polypropylene. FIG. 10F is a diagram illustrating the relationship among areas of the pin extension strip (e.g., the area of the pin extension strip 153 or 155 of FIG. 1D), the thickness t between the pin extension strip and the metalized layer of the packing material, the imaginary part of the impedance (jX), with respect to the double-side structure of the third embodiment and the single-side structure of the fourth embodiment. In FIG. 10F, with respect to the single-side structure, curves L11, L12, L13, and L14 represent the relationship between the thickness t of the metalized layer and the imaginary part of the impedance when the area of the pin extension strip are 9 $mm^2$, 25 $mm^2$, 100 $mm^2$, and 150 $mm^2$, respectively. With respect to the double-side structure, curves L21, L22, L23, and L24 represent the relationship between the thickness t of the metalized layer and the imaginary part of the impedance when the area of the pin extension strip are 9 $mm^2$, 25 $mm^2$, 100 $mm^2$, and 150 $mm^2$, respectively.

As shown in FIG. 10F, when the area of the pin extension strip becomes smaller (such as the ones represented by curves L11, L21, L12, and L22), the change in the imaginary part of the impedance becomes larger with respect to the change in the thickness. For the same change in thickness t, the change in the imaginary part of the impedance is smaller for the double-side structure than for the single-side structure. Hence, the double-side structure can reduce the change in the imaginary part of the impedance due to the change in the coupling thickness t, resulting in stability in process of embedding the radio frequency device. As obtained from the above results, when the electromagnetic coupling is used, the area of the pin extension strip of the radio frequency device should be preferably greater than 25 $mm^2$. In addition, the curves L13, L14, L22, L23, and L24 have smaller slopes or they changes stably and in relative, a small variance in coupling thickness t would lead to insignificant change in the imaginary part of the impedance. Accordingly, signal transfer between the radio frequency device and the metalized layer of the packing material (or conductive layer) can be achieved by coupling in the implementation with the manners of covering the chip in the third and fourth embodiment.

Therefore, in the embodiments of the disclosure, the signal transfer between the radio frequency device and the metallized layer of the packing material (or conductive layer) or between the radio frequency device and the impedance matching member of the bag body can be achieved by various coupling manners, i.e., electrical connection or electromagnetic coupling or both of them, in various embodiments. For example, the first packing material 1010 and the second packing material 1020 of the third embodiment are combined to form an impedance matching member; and the radio frequency device 150 is disposed on one side of the combination of the first and second packing materials 1010 and 1020; and signal transfer between the radio frequency device 150 and the first and second packing materials 1010 and 1020 is achieved by electromagnetic coupling. This single-side structure using two packing materials has similar characteristic, performance, and size of the pin extension strip to those of the single-side structure of the fourth embodiment. In addition, the radio frequency device 150 is disposed across the slot of the upper or lower side of the combination of the two packing materials.

In addition, the packing materials in the above third and fourth embodiments each include at least a metallized layer (or conductive layer) and a dielectric layer, wherein the metallized layer is the conductive portion in the embodiments. The metallized layer includes metal, such as aluminum, copper and so on, and the way of formation is by way of electroplating, laminated aluminum strip, or vapor deposition. The dielectric layer, for example, includes polymer material, such as polypropylene, polyethylene, or polyester. Besides, the packing material can be multi-layered combination with duplication, for example, structure of multi-layer of dielectric layers or multi-layer of metallized layer, such as three layers, four layers or above; for example, the structure of three-layered packing material as shown in FIG. 10E. Further, the first, the second, or the third packing material 1010, 1020, or 1030 can be implemented with individual structure.

Moreover, in some embodiments, the impedance matching member of FIG. 1A or 5A further includes insulation material, which is made from such as plastics (such as PE and PET) for coating (e.g., upper or lower layer) or laminating the conductive portion and its slot(s).

In other embodiments, the conductive portion can be made from flexible material such as aluminum film or other metallic films.

In practical implementation, the first slot can be disposed in the middle, the left or the right, and the packing bag can be of an ordinary size such as 10 cm×10 cm or different sizes. The packing bags implemented according to the embodiments have stable impedance characteristics and excellent performance in radio-frequency signal reception and transmission.

Other Embodiments

Figure 11A:
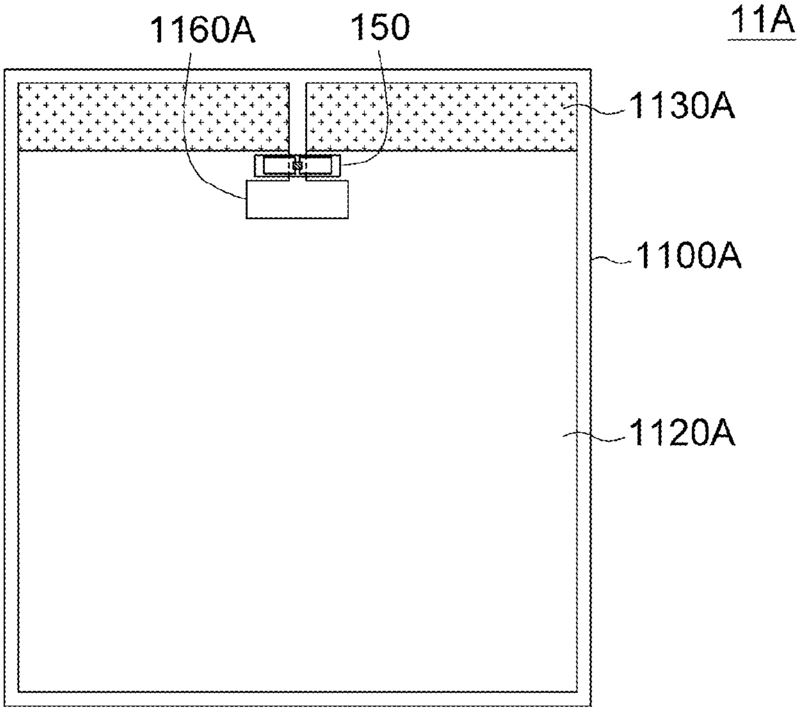
FIGS. 11A-11C show wireless communication apparatuses according to other embodiments.
Figure 11B:
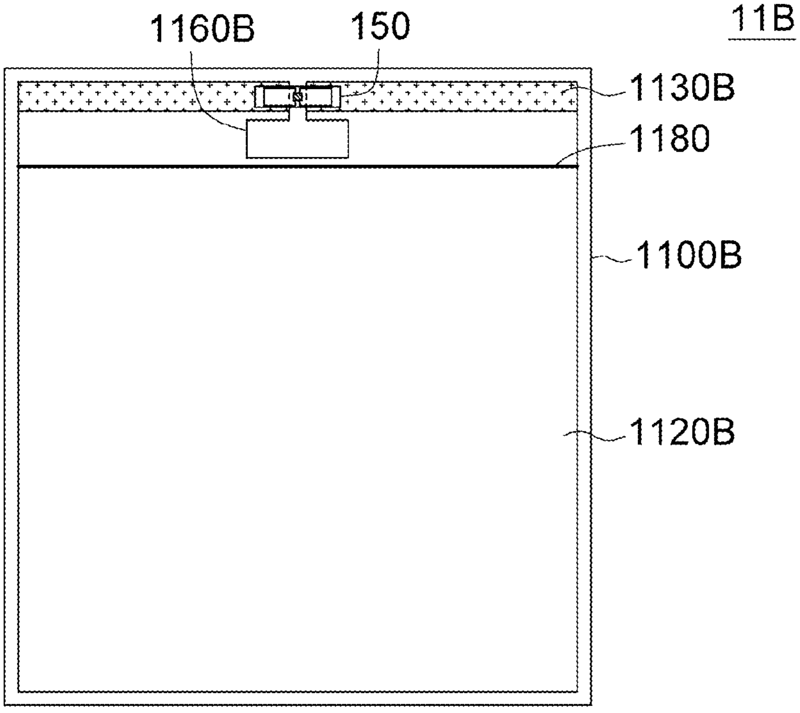
Figure 11C:
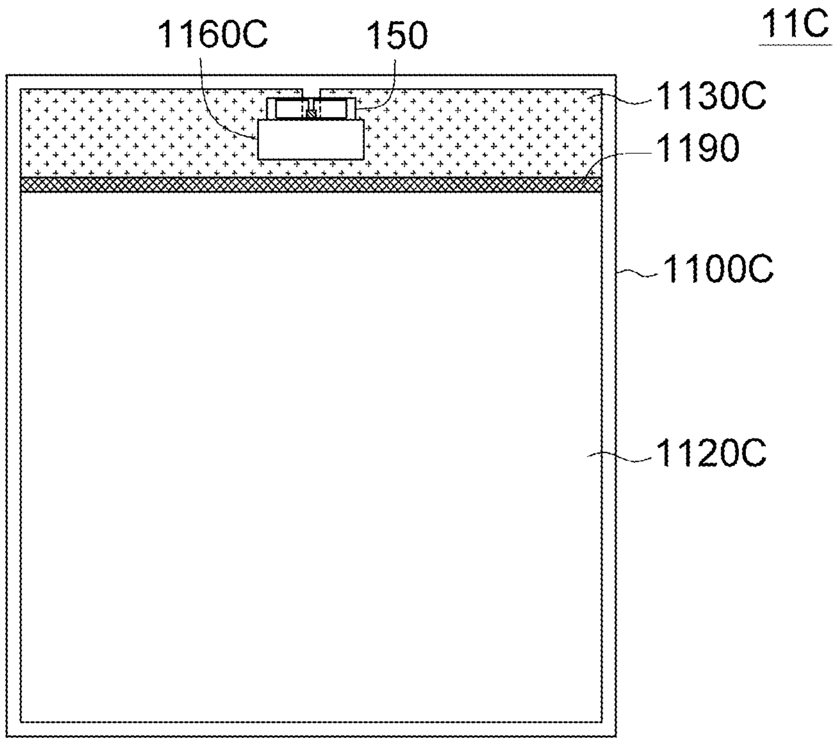

In the above embodiments, the first slot is located on the impedance matching member, but the implementations of the disclosure are not limited to the embodiments. Referring to FIGS. 11A-11C, other embodiments are further disclosed.

The wireless communication apparatus 11A of FIG. 11A differs from the above embodiments in that the bag body 1100A has a first slot 1160A, which is located on the packing member 1120A, extends across the sealing portion 1130A (or regarded as the impedance matching member) and to an edge of the bag body 1100A. In FIG. 11A, the wireless communication element 150 is disposed across the first slot 1160A and connected to two connection ends of the packing member 1120A.

The wireless communication apparatus 11B of FIG. 11B differs from the wireless communication apparatus 11A of FIG. 11A in that the packing member 1120B further includes a hermetically sealed bar 1180, which separates the first slot 1160B of the bag body 1100B from a portion of the packing member 1120B. In FIG. 11B, the wireless communication element 150 is disposed across the first slot 1160B and connected to the two connection ends of the sealing portion 1130B.

The wireless communication apparatus 11C of FIG. 11C is similar to the first and the second embodiment in that the first slot 1160C is located on the sealing portion 1130C, but the difference lies in that the bag body 1100C further includes a non-conductive portion 1190, which separates the metallic film of the sealing portion 1130C from the metallic film of the packing member 1120C. For example, the non-conductive portion 1190 can be formed by laser cutting or hollowing.

Figure 12A:
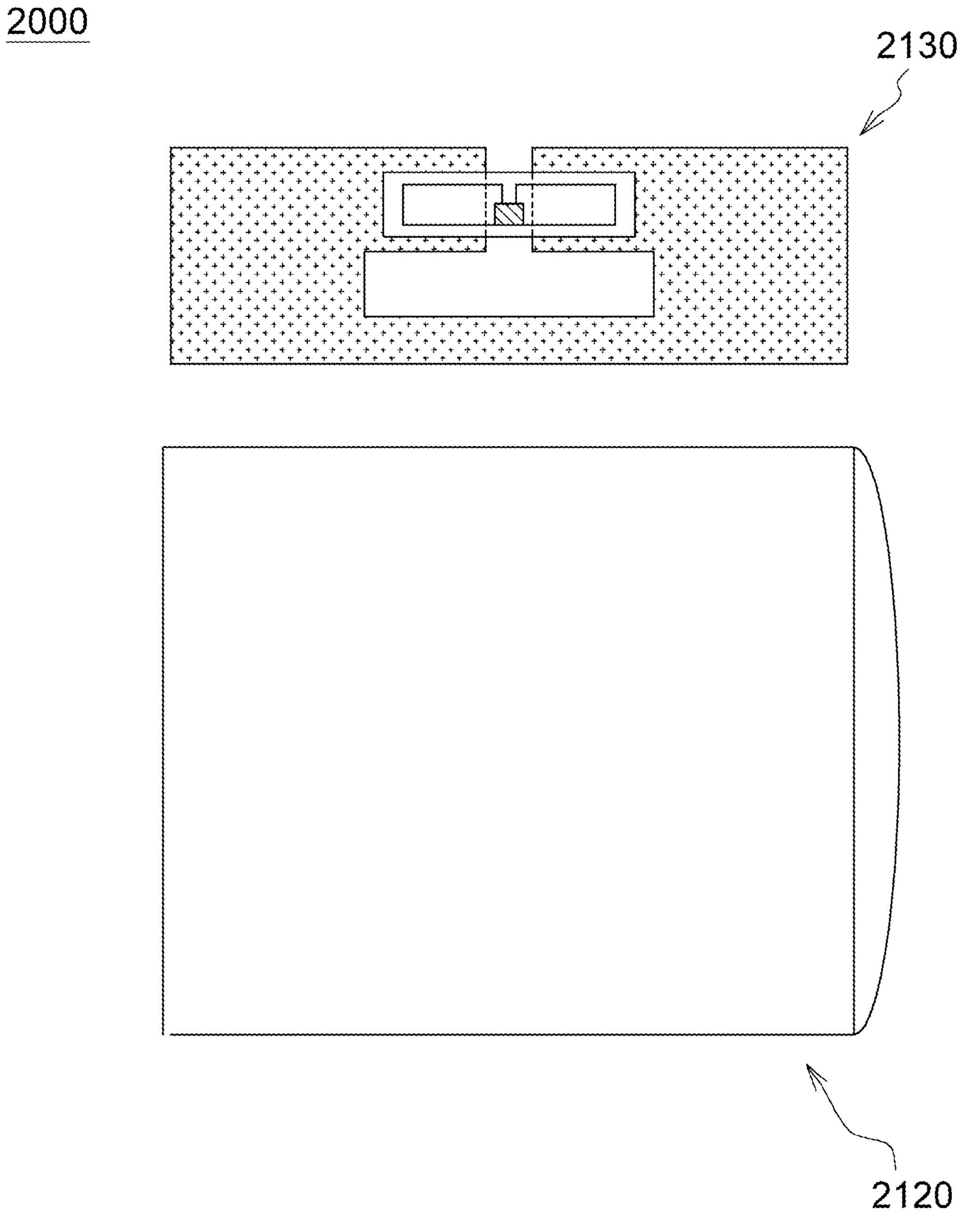
FIGS. 12A-12B show a wireless communication apparatus according to another embodiment.
Figure 12B:
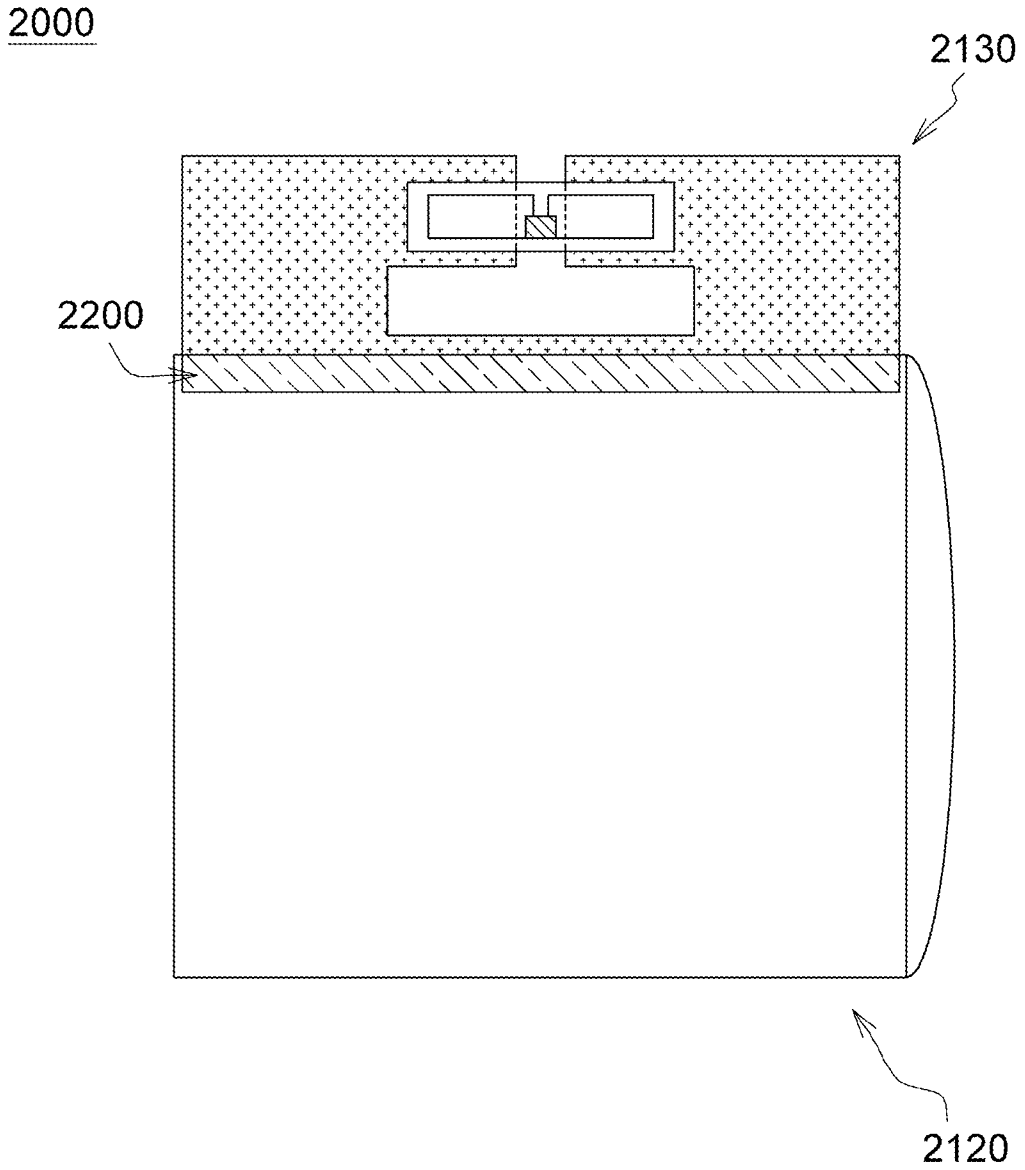

Moreover, FIGS. 12A-12B show a wireless communication apparatus 2000 based on the first embodiment of FIG. 1A. As shown in FIG. 12A, the impedance matching member 2130 and the packing member 2120 are manufactured individually. After that, as shown in FIG. 12B, the impedance matching member 2130 and the packing member 2120 are combined on a conductive overlapping portion 2200 so as to facilitate the wireless communication of the bag body. The conductive overlapping portion 2200 can be implemented in electrical connection or electromagnetic coupling, for example, by the various implementations as above exemplified.

In short, any disposition of a first slot resulting in the portion of the bag body between the two connection ends for electrical connection of the communication component to serve as an inductance circuit can also be regarded as an embodiment according to the disclosure for radio-frequency signal transmitting or receiving. The inductance circuit between the two connection ends is based on metallic material, such as aluminum film or other suitable metallic materials as a conductive layer. Thus, the inductance circuit can be used to be conjugate matched to the radio frequency device.

Although the above embodiments are exemplified by a packing bag, the exemplification is not for limiting the embodiment for implementation. The above embodiments can further be used in various packing bags such as a packing bag having sealing region at the top side, the left and right sides, the top and bottom sides, or the left, right, top, and bottom sides. In short, if at least a slot or two slots are implemented on the sealing region of the packing bag of the same side according to the spirit of the above first or the second embodiment, the impedance matching member or the sealing portion can be implemented accordingly for matching the wireless communication chip. In other embodiments, based on the functions of the inductance circuit of the above embodiments, other implementations and usage can be derived, for example, the provision of accommodation space for packing other objects or for use as a part of the object.

Moreover, the impedance of the radiator can further be adapted according to the characteristics relating to the impedance and the shape of the impedance matching member disclosed in the above embodiments to match various wireless communication chips, for example, chips for industrial scientific medical band (ISM) system, such as chips for wireless personal area network like Bluetooth, or chips for near field communication.

The wireless communication apparatus disclosed in the above embodiments of the disclosure has different effects exemplified below:

The structure disclosed in the first embodiment is applicable to a metallized bag to form an impedance matching member with a slot structure on an edge region, wherein the impedance can be adjusted for matching various RFID modules by adjusting the size of the slot and the connection position of the communication chip or wireless integrated circuit chip.

The structure disclosed in the second embodiment is applicable to a metallized bag to form a loop and hollowed slot structure on an edge region with an additional slot on the structure for impedance adjustment, wherein the hollowed structure is used for increasing the antenna bandwidth and providing the excellent performance within the entire communication band.

In the third embodiment, the double-side structure in which the radio frequency device is embedded in the bag body utilizes two kinds of signal transfer approaches: electromagnetic coupling and electrical connection, thus enhancing the quality of signal transfer and increasing the stability of the process of embedding the radio frequency device. In the fourth embodiment, the single-side structure in which the radio frequency device is covered in the bag body employs electrical connection, leading to the thickness of the whole apparatus to be reduced.

In the above embodiments, the radio frequency device and the radiator are connected based on electrical connection rather than only electromagnetic coupling. As the variance in coupling thickness does not affect the coupling effect, no additional circuit is needed for compensating for the above adverse effect on the antenna impedance caused by variance in the coupling thickness.

In addition, there are other embodiments where the radio frequency device and the conductive layer of the packing material (i.e., radiators) are electromagnetic coupled, such as the above embodiment of the combination of two packing materials on one side of which the radio frequency device is disposed.

In the embodiments using electromagnetic coupling, the pin extension strips of the radio frequency device can be designed with a larger area so as to achieve an improved stability of the process of covering the radio frequency device. The influence of a small variance of the coupling thickness t on the imaginary part of the impedance will become insignificant or substantially would not occur.

In some embodiments, the packing member of the packing bag provides a larger conductive portion to achieve better radiation and reception, so that the embodiments of metallized bag have better performance in wireless communication and are easier to implement.

While the disclosure has been described by way of examples and in terms of preferred embodiments, it is to be understood that the disclosure is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A wireless communication apparatus, comprising:

a packing bag body having at least a first slot, the first slot extending to an edge of the packing bag body; wherein the packing bag body comprises:

an impedance matching member, comprising a first conductive portion, wherein the first conductive portion has at least the first slot, the first slot being located on the first conductive portion and extending to the edge of the first conductive portion; and a packing member providing a space for packing things, comprising a second conductive portion, wherein the second conductive portion is substantially connected to the first conductive portion;

a radio frequency device, including a wireless integrated circuit chip, for radio-frequency signal transmitting or receiving, the radio frequency device being located in the impedance matching member and disposed across a portion of the first slot and coupled to two connection ends of the packing bag body;

wherein a portion of the packing bag body between the two connection ends serves as an inductance circuit and the inductance circuit is based on a metallic material, an impedance of the inductance circuit is for conjugate matching with an impedance of the wireless integrated circuit chip and is determined according to at least a plurality of geometric parameters including a distance from the edge to the wireless integrated circuit chip, and size of the first slot.

2. The wireless communication apparatus according to claim 1, wherein the radio frequency device further comprises:

first and second pin extension strips, coupled to the two connection ends of the packing bag body, for extension of two connection pins of the wireless integrated circuit chip; and a dielectric layer, wherein the first pin extension strip and the second pin extension strip are disposed on the dielectric layer.

3. The wireless communication apparatus according to claim 1, wherein the conductive portion of the impedance matching member further has a second slot, the second slot is located on the conductive portion of the impedance matching member and extends to an edge of the conductive portion of the impedance matching member.

4. The wireless communication apparatus according to claim 1, wherein the first slot comprises a first sub-slot and a second sub-slot, the first sub-slot is connected to the second sub-slot and extends to the edge of the packing bag body, and the radio frequency device is disposed across the first sub-slot.

5. The wireless communication apparatus according to claim 1, wherein the packing bag body further comprises a sealing portion, wherein the sealing portion and the packing member are composed of metallic film and the first slot is located on the sealing portion.

6. The wireless communication apparatus according to claim 2, wherein the packing bag body comprises:

a first packing material, comprising at least a metallized layer and a dielectric layer, wherein the first and second pin extension strips are coupled to the metallized layer of the first packing material corresponding to the two connection ends of the packing bag body.

7. The wireless communication apparatus according to claim 2, wherein the packing bag body comprises:

a first packing material, comprising at least a metallized layer and a dielectric layer, wherein the first and second pin extension strips are coupled to the metallized layer of the first packing material corresponding to the two connection ends of the packing bag body; and a second packing material, comprising at least a metallized layer and a dielectric layer, wherein the first and the second packing materials are combined, the radio frequency device is disposed on one side of the combination of the first and the second packing materials, the first and second pin extension strips are electromagnetically coupled to the metallized layer of the first packing material or the second packing material, corresponding to the two connection ends of the packing bag body.

8. The wireless communication apparatus according to claim 3, wherein the second slot has a length of substantially corresponding ¼ wavelength of an operating frequency of the radio frequency device.

9. The wireless communication apparatus according to claim 3, wherein the geometric parameters further include the length of the second slot and a distance between the second slot and the first slot.

10. The wireless communication apparatus according to claim 4, wherein the packing bag body further comprises a sealing portion, the second sub-slot is located on the packing member, and the first sub-slot extends inwardly from the edge of the packing bag body and across the sealing portion and connects with the second sub-slot.

11. The wireless communication apparatus according to claim 5, wherein the packing bag body further comprises a non-conductive portion separating the metallic film of the sealing portion from the metallic film of the packing member.

12. The wireless communication apparatus according to claim 5, wherein the metallic film of the sealing portion and the metallic film of the packing member are coupled.

13. The wireless communication apparatus according to claim 6, wherein the packing bag body further comprises:

a second packing material, comprising at least a metallized layer and a dielectric layer, wherein the radio frequency device is disposed between the first packing material and the second packing material so that the two pin extension strips are electromagnetically coupled to the metallized layer of the second packing material corresponding to the two connection ends of the packing bag body.

14. The wireless communication apparatus according to claim 6, wherein the first and second pin extension strips are electrically connected to the metallized layer of the first packing material corresponding to the two connection ends of the packing bag body.

15. A wireless communication apparatus, comprising:

a packing bag body having at least a first slot and a second slot, wherein the first slot extends to an edge of the packing bag body, and the second slot extends inwardly into the packing bag body and is separated from the first slot; and wherein the packing bag body comprises:

an impedance matching member, comprising a first conductive portion, wherein the first conductive portion has at least the first slot, the first slot being located on the first conductive portion and extending to the edge of the first conductive portion and the second slot extends inwardly to the other edge of the first conductive portion; and a packing member providing a space for packing things, comprising a second conductive portion, wherein the second conductive portion is substantially connected to the first conductive portion;

a radio frequency device, including a wireless integrated circuit chip, for radio-frequency signal transmitting or receiving, the radio frequency device being located in the impedance matching member and disposed across a portion of the first slot and coupled to two connection ends of the packing bag body, wherein a portion of the packing bag body between the two connection ends serves as an inductance circuit and the inductance circuit is based on a metallic material, an impedance of the wireless integrated circuit chip is for conjugate matching with an impedance of the radio frequency device and is determined according to at least a plurality of geometric parameters including a distance from the edge to the wireless integrated circuit chip, size of the first slot, length of the second slot, and a distance between the second slot and the first slot.

16. The wireless communication apparatus according to claim 15, wherein the radio frequency device comprises:

first and second pin extension strips, coupled to the two connection ends of the packing bag body, for extension of two connection pins of the wireless integrated circuit chip; and a dielectric layer, wherein the first pin extension strip and the second pin extension strip are disposed on the dielectric layer.

17. The wireless communication apparatus according to claim 16, wherein the second slot has a length of substantially corresponding ¼ wavelength of an operating frequency of the radio frequency device.

* * * * *